(12) United States Patent
Benjamin et al.

(10) Patent No.: US 10,896,808 B2
(45) Date of Patent: Jan. 19, 2021

(54) MAINTENANCE MODE POWER SUPPLY SYSTEM

(71) Applicant: Lam Research Corporation, Fremont, CA (US)

(72) Inventors: Neil Martin Paul Benjamin, Palo Alto, CA (US); John Pease, San Mateo, CA (US)

(73) Assignee: Lam Research Corporation, Fremont, CA (US)

( * ) Notice: Subject to any disclaimer, the term of this patent is extended or adjusted under 35 U.S.C. 154(b) by 209 days.

(21) Appl. No.: 16/045,644

(22) Filed: Jul. 25, 2018

(65) Prior Publication Data

US 2020/0035460 A1    Jan. 30, 2020

(51) Int. Cl.
*H01J 37/32*    (2006.01)
*H02H 9/02*    (2006.01)

(52) U.S. Cl.
CPC .... *H01J 37/32174* (2013.01); *H01J 37/3288* (2013.01); *H02H 9/02* (2013.01); *H01J 2237/24564* (2013.01); *H01J 2237/24592* (2013.01)

(58) Field of Classification Search
CPC .......... H02H 9/041; H02H 9/02; H02H 3/207; H02H 9/001; H01J 37/3288; H01J 37/32174; H01J 2237/24564; H01J 2237/24592; H02J 1/084
See application file for complete search history.

(56) References Cited

U.S. PATENT DOCUMENTS

2014/0265852 A1    9/2014    Valcore, Jr.
2017/0358429 A1    12/2017    Nitschke

FOREIGN PATENT DOCUMENTS

EP    3091559    11/2016
JP    2007115688    5/2007
KR    20170044010    4/2017

OTHER PUBLICATIONS

"International Application Serial No. PCT US2019 043498, International Search Report dated Nov. 13, 2019", 9 pgs.
"International Application Serial No. PCT US2019 043498, Written Opinion dated Nov. 13, 2019", 5 pgs.

*Primary Examiner* — Yuechuan Yu
(74) *Attorney, Agent, or Firm* — Schwegman Lundberg & Woessner, P.A.

(57) ABSTRACT

A dual mode power device for controlling voltage level to a plasma processing apparatus is disclosed. The dual mode power device comprises a power supply connector and a control circuit. The power supply connector is connected to a first voltage power supply or a second voltage power supply. The control circuit is connected between an output of the power supply connector and a first and second voltage subsystem of the plasma processing apparatus. The control circuit provides a first voltage based on the first voltage power supply to the first voltage subsystem in a first mode of operation of the plasma processing apparatus. The control circuit provides a second voltage based on the second voltage power supply to the second voltage subsystem in a second mode of operation of the plasma processing apparatus.

20 Claims, 5 Drawing Sheets

MAINTENANCE MODE POWER SUPPLY SYSTEM

TECHNICAL FIELD

The present application relates generally to the technical field of a power supply system, and, in various embodiments, to a dual mode power supply system for powering and maintaining a plasma processing apparatus.

BACKGROUND

Semiconductor processing systems are generally used to process semiconductor wafers for fabrication of integrated circuits. For example, plasma-enhanced semiconductor processes are commonly used in etching, oxidation, and chemical vapor deposition (CVD). The plasma-enhanced semiconductor processes are typically carried out by means of plasma processing systems and generally include a plasma processing chamber to provide a controlled setting.

Conventional plasma processing chambers often include electrostatic chucks (ESCs) to hold wafers (e.g., silicon wafer or substrates) in place for processing. An electrostatic chuck utilizes electrostatic force to clamp the wafer to the chuck. A conventional plasma processing system includes a plasma processing chamber, a radio frequency (RF) power supply, and an electrostatic chuck power supply.

SUMMARY

In one example embodiment, a dual mode power device comprises a power supply connector and a control circuit. The power supply is coupled to one of a first voltage power supply or a second voltage power supply. The control circuit is coupled between an output of the power supply connector and a first and second voltage subsystem of a plasma processing apparatus. The control circuit provides a first voltage based on the first voltage power supply to the first voltage subsystem in a first mode of operation of the plasma processing apparatus. The control device provides a second voltage based on the second voltage power supply to the second voltage subsystem in a second mode of operation of the plasma processing apparatus.

In another example embodiment, the first mode of operation includes an operating mode of the plasma processing apparatus using the first voltage. The second mode includes a maintenance mode of the plasma processing apparatus using the second voltage. The operating mode is configured to process a wafer disposed in a chamber of the plasma processing apparatus. The maintenance mode is configured to test components of the plasma processing apparatus.

In another example embodiment, the control circuit detects the first voltage, provides the first voltage to the first voltage subsystem in the operating mode, converts the first voltage to the second voltage, and provides the second voltage to the second voltage subsystem in the operating mode.

In another example embodiment, the power supply connector includes a single input connector configured to receive one of the first voltage power supply or the second voltage power supply.

In another example embodiment, the control circuit comprises a first electrical circuit and a second electrical circuit. The first electrical circuit is connected between the output of the power supply connector and an input of the first voltage subsystem. The second electrical circuit is connected between the output of the power supply connector and an input of the second voltage subsystem.

In another example embodiment, the second electrical circuit comprises a fuse, a primary surge prevention circuit, a secondary surge prevention circuit, an inrush protection circuit, a Direct Current (DC) to DC converter, a first mode circuit, and a diode-based switch circuit. The fuse is provided as passive fault current protection. The primary surge prevention circuit is configured to be triggered in response to detecting, on the second electrical circuit, the first voltage generated by the first voltage power supply. The secondary surge prevention circuit is coupled to the primary surge prevention circuit. The secondary surge prevention circuit is configured to trigger the fuse in response to the primary surge prevention circuit failing to operate. The inrush protection circuit is coupled to the primary and secondary surge prevention circuits. The inrush protection circuit limits a current from the primary and secondary surge prevention circuit. The DC to DC converter is coupled to the fuse and converts the first voltage to the second voltage. The first mode circuit is coupled to the primary surge prevention circuit. The first mode circuit disables the primary surge prevention circuit in response to detecting the first voltage generated by the first voltage power supply. The diode-based switch circuit is coupled to the inrush protection circuit and the DC to DC converter. The diode-based switch circuit selects between an output of the inrush protection circuit and an output of the DC to DC converter.

In another example embodiment, the fuse is configured to disable power to the second electrical circuit. In another example embodiment, the fuse is configured to disable power to a maintenance voltage path, with the maintenance voltage path being formed with the primary surge prevention circuit, the secondary surge prevention circuit, and the inrush protection circuit.

In another example embodiment, the primary surge prevention circuit includes at least one of a bootstrap current-based surge suppressor with automatic restart, a bootstrap current-based surge suppressor without automatic restart, a plurality of floating gates, a depletion mode pass element with ground reference control circuit, a depletion mode pass element, or a mechanical relay.

In another example embodiment, the secondary surge prevention circuit includes at least one of a clamp circuit, a shunt voltage regulator, or a shunt transistor switch.

In another example embodiment, an output of the DC to DC converter is used to disable the primary surge prevention circuit or the inrush protection circuit.

In another example embodiment, an output of the secondary surge prevention circuit is used to disable the primary surge prevention circuit or the inrush protection circuit.

In another example embodiment, an input voltage at the fuse is used to turn off the primary surge prevention circuit in response to the input voltage corresponding to the first voltage of the first voltage power supply.

In another example embodiment, the dual mode power device further comprises a RF filter and a switch. The RF filter is disposed between the output of the power supply connector and the control circuit. The RF filter filters signals from the first voltage power supply. The switch is coupled to the first voltage power supply and the second voltage power supply. The switch connects the first voltage power supply to the control circuit in the first mode of operation, and the second voltage power supply to the control circuit in the second mode of operation.

In another example embodiment, the first voltage is more than 300 Volts, wherein the second voltage is less than 15 Volts.

BRIEF DESCRIPTION OF THE DRAWINGS

Some embodiments of the present invention are illustrated by way of example and not limitation in the figures of the accompanying drawings, in which like reference numbers indicate similar elements and in which.

DETAILED DESCRIPTION

The description that follows includes illustrative systems, methods, techniques, instruction sequences, and computing machine program products that embody illustrative embodiments. In the following description, for purposes of explanation, numerous specific details are set forth in order to provide an understanding of various embodiments of the inventive subject matter. It will be evident, however, to those skilled in the art that embodiments of the inventive subject matter may be practiced without these specific details. In general, well-known instruction instances, protocols, structures, and techniques have not been shown in detail.

The present disclosure describes a dual mode power device for controlling voltage level to a plasma processing apparatus (e.g., plasma processing chamber for processing wafers). Conventionally, separate power connectors and wiring are used for maintenance mode (low voltage) and normal operating mode (high voltage) in a plasma processing apparatus. Thus, the plasma processing apparatus can include a first power supply input connector connected to a first set of wires used for the high voltage power, and a second power supply input connector connected to a second set of wires used for the low voltage power. The additional wiring (from the combined first and second set of wires and the combined first and second power supply input connectors) increases the physical complexity of the plasma processing apparatus by utilizing limited physical space in the plasma processing chamber. The additional wiring can also degrade performance of a RF filter disposed between the plasma processing chamber and the power supply input connectors. It may be difficult to incorporate separate low voltage wires and connectors because of the RF filtering components between the ESC and the power supply input connectors. An RF feed-rod from the RE filter utilizes additional space to route these additional wires. Furthermore, a maintenance technician of the plasma processing apparatus could also be exposed to high voltage on the low voltage connector if the insulation failure causes high voltage to leak through to the low voltage wires.

The present disclosure describes a dual mode control circuit that enables testing of low voltage subsystems (e.g., heater elements) installed in the ESC area of the plasma processing chamber with safer low voltage power instead of the high voltage power supplied during normal operation. The low voltage is connected to a single power supply connector during maintenance mode using the same wires and connectors. As such, the same power supply connector can be connected to either the high voltage power supply or the low voltage power supply. In one example embodiment, a switch may couple the high voltage power supply and the low voltage power supply to the same power supply connector. The switch can thus switch between the high voltage power supply or the low voltage power supply.

Figure 1A:
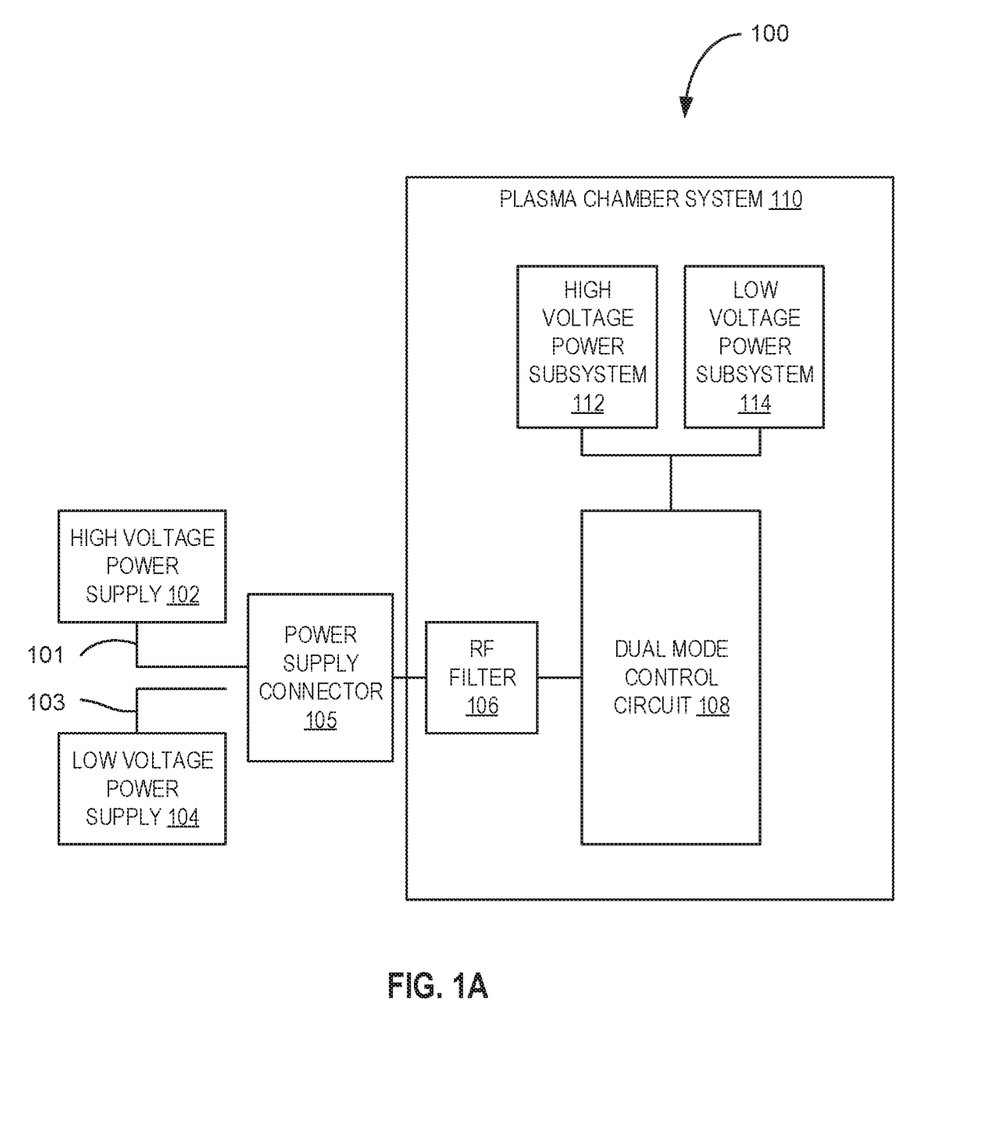
FIG. 1A is a block diagram depicting a plasma chamber system connected to a high voltage power supply, according to an example embodiment.

The dual mode control circuit provides high voltage to high voltage subsystems (e.g., antenna coil, heater element, ESC) for normal operation and, through mode switching control, provides a safe low voltage during maintenance mode. The dual model control circuit detects low voltage desired for the maintenance mode and powers the low voltage power subsystem of the plasma processing chamber with the low voltage. When the control circuit detects high voltage at the single power supply connector desired for normal operation, the control circuit prevents the high voltage from reaching the low voltage power subsystem of the plasma processing chamber by converting the high voltage to the low voltage and by providing the low voltage to the low voltage power subsystem, FIG. 1A is a block diagram depicting an arrangement 100 comprising a plasma chamber system 110 with a (single) power supply connector 105 connected to a high voltage power supply 102, according to an example embodiment. High voltage wires 101 connect the high voltage power supply 102 to an input of the power supply connector 105. The high voltage power supply 102 is configured to generate a high voltage power (e.g., more than 300 Volts). The low voltage power supply 104 is connected to low voltage wires 103. The input of the power supply connector 105 can be physically connected to only one of the wires 101 or 103. FIG. 1A illustrates the power supply connector 105 being connected only to the high voltage power supply 102 and not the low voltage power supply 104. Therefore, high voltage wires 101 are physically plugged into the input of the power supply connector 105. To switch voltage supply, an operator or user of the plasma chamber system 110 would manually unplug the high voltage wires 101 from the input of the power supply connector 105, and manually plug the low voltage wires 103 to the input of the power supply connector 105.

In another example embodiment, both the high voltage power supply 102 and the lower voltage power supply 104 are connected to a switch (not shown) that is connected to the input of the power supply connector 105. The switch connects either the high voltage power supply 102 or the low voltage power supply 104 to the input of the power supply connector 105.

The plasma chamber system 110 includes an RE filter 106, a dual mode control circuit 108, a high voltage power subsystem 112, and a low voltage power subsystem 114. The RF filter 106 is connected to an output of the power supply connector 105 and filters radio frequencies from the high voltage power generated by the high voltage power supply 102. An output of the RE filter 106 is connected to the dual mode control circuit 108.

The dual mode control circuit 108 detects the high voltage power from the power supply connector 105 and provides the high voltage power to the high voltage power subsystem 112. In another example embodiment, the dual mode control circuit 108 detects the high voltage power from the power supply connector 105, converts the high voltage power to a low voltage power, and provides the low voltage power to the low voltage power subsystem 114.

The dual mode control circuit 108 controls whether high voltage power or low voltage power is provided to the high voltage power subsystem 112 or the low voltage power subsystem 114 based on an operating mode of the plasma chamber system 110. For example, the dual mode control circuit 108 enables high voltage power to be provided to the high voltage power subsystem 112 in a normal operating mode. The high voltage power subsystem 112 includes high voltage components that enable the plasma chamber system 110 to process a wafer with plasma. For example, the high voltage components include coils, heater elements, and the ESC. The normal operating mode includes a mode suitable for powering the high voltage components of the high voltage power subsystem 112 to process the wafer with plasma.

The dual mode control circuit 108 also enables low voltage power to be provided to the low voltage power subsystem 114 in a maintenance mode. The low voltage power subsystem 114 includes low voltage components used for testing and calibrating low voltage components. For example, the low voltage components include heater control circuits and heater elements in the chamber of the plasma chamber system 110. The maintenance mode includes, for example, a mode suitable for powering and testing the low voltage components of the low voltage power subsystem 114. In one example embodiment, the high voltage power subsystem 112 and the low voltage power subsystem 114 share some of the same elements (e.g., heater control circuits, heater elements) that are respectively used for different purposes in the normal operating mode and the maintenance mode. In another example, elements from the low voltage power subsystem 114 are distinct from elements from the high voltage power subsystem 112.

Figure 1B:
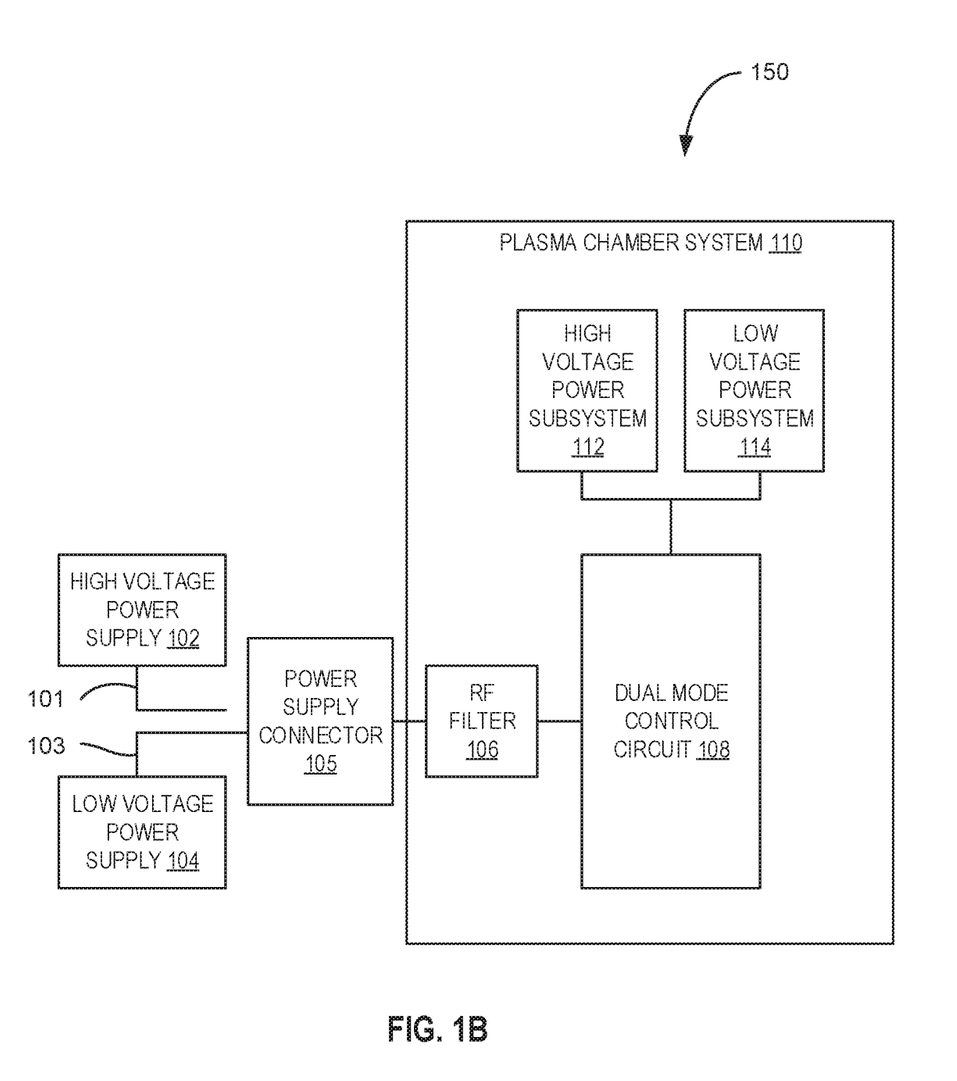
FIG. 1B is a block diagram depicting a plasma chamber system connected to a low voltage power supply, according to an example embodiment.

FIG. 1B is a block diagram depicting an arrangement 150 comprising the plasma chamber system 110 with the (single) power supply connector 105 connected to the low voltage power supply 104 (and not to the high voltage power supply 102), according to an example embodiment. Low voltage wires 103 connect the low voltage power supply 104 to an input of the power supply connector 105. The low voltage power supply 104 is configured to generate a low voltage power (e.g., less than 15 Volts).

The dual mode control circuit 108 detects the low voltage power from the power supply connector 105 and provides the low voltage power to the low voltage power subsystem 114. In one example embodiment, when the dual mode control circuit 108 detects the low voltage power, the dual mode control circuit 108 determines a maintenance mode (based on measuring the low voltage power) and does not provide any power to the high voltage power subsystem 112.

Figure 2:
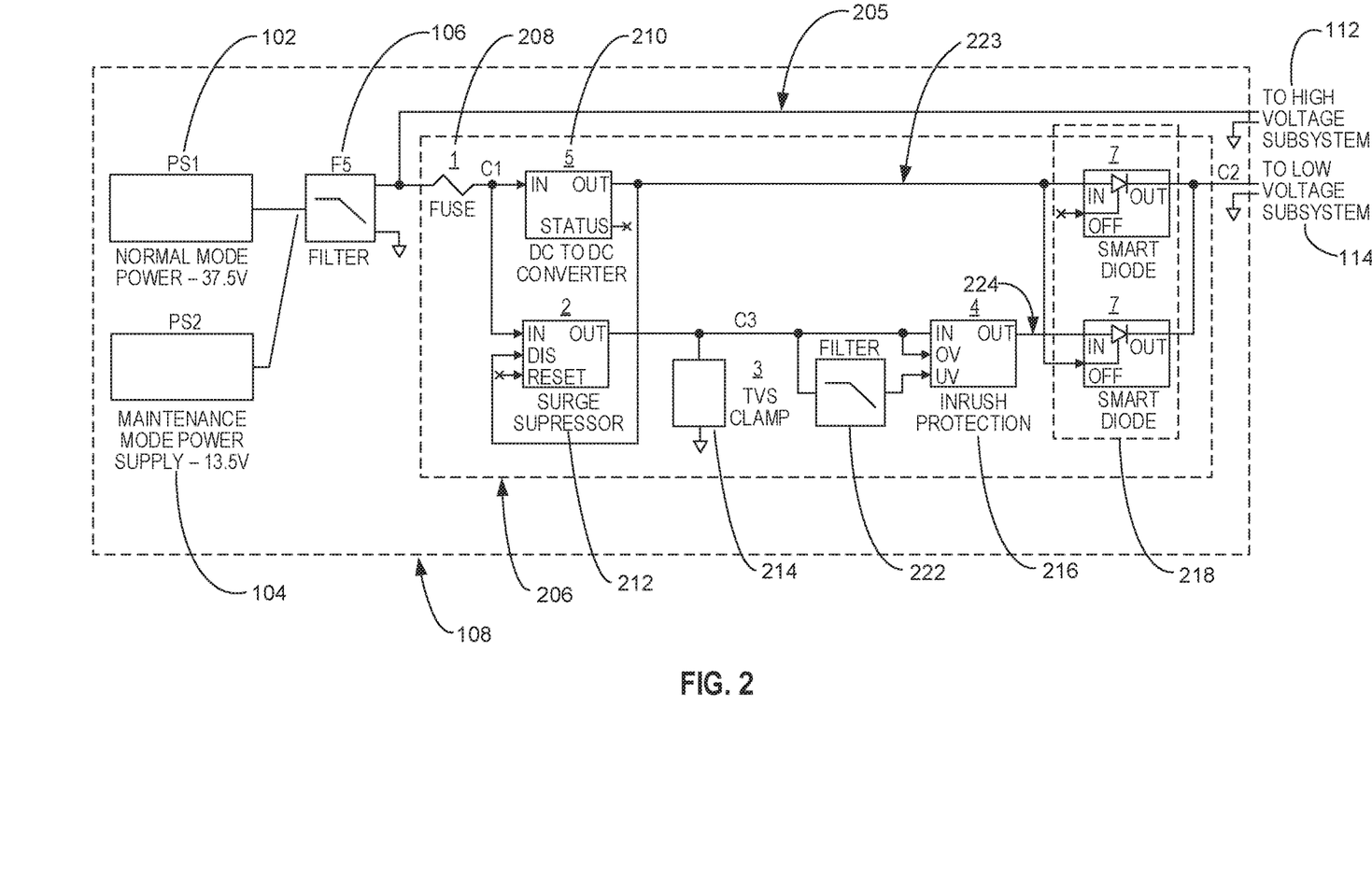
FIG. 2 is a block diagram depicting an example embodiment of a dual mode control circuit.

FIG. 2 is a block diagram depicting an example embodiment of the dual mode control circuit 108. The dual mode control circuit 108 includes a high voltage circuit 205 and a low voltage circuit 206. During the normal operating mode, the high voltage circuit 205 provides high voltage power from the high voltage power supply 102 (via an output of the RF filter 106) to the high voltage power subsystem 112. The low voltage circuit 206 protects the low voltage power subsystem 114 from the high voltage power during the normal operating mode. During the maintenance mode, the low voltage circuit 206 connects the low voltage power supply 104 (via the output of the RF filter 106) to the low voltage power subsystem 114.

In one example embodiment, the low voltage circuit 206 includes a fuse 208, a first low voltage path 223, and a second low voltage path 224. The fuse 208 is configured to be break an electric circuit when high voltage power is detected on the low voltage circuit 206. In one example embodiment, high voltage power is removed from both the first low voltage path 223 and the second low voltage path 224. In another example embodiment, high voltage power is removed from the second low voltage path 224 while the high voltage power can flow through the first low voltage path 223 to a DC to DC converter 210.

In another example embodiment, a diode or circuit could be used to provide the low maintenance mode input voltage to both the high and low voltage sub-systems. Separate high voltage and low voltage wires would have to be run through the filter up to the diode circuit. Therefore, the filter 106 would have both high voltage and low voltage inputs and outputs.

The first low voltage path 223 includes the DC to DC converter 210 and a diode-based switching circuit 218. The DC to DC converter 210 converts high voltage power to low voltage power. In one example embodiment, the DC to DC converter 210 includes input voltage monitoring, over current protection, and programmable output voltage features. The diode-based switching circuit 218 includes a switching circuit low loss diode-based switching circuit) that automatically selects either the output of first low voltage path 223 or the output of the second low voltage path 224 to provide low voltage power to the low voltage power subsystem 114.

The second low voltage path 224 includes a primary surge prevention circuit 212, a secondary surge prevention circuit 214, and an inrush protection circuit 216. The primary surge prevention circuit 212 is connected to the fuse 208. The primary surge prevention circuit 212 operates in three modes: (1) it provides low voltage present in maintenance mode with low loss; (2) it regulates intermediate voltages down to a safer lower voltage; and (3) it turns off during normal operation when high voltage is present. In one example embodiment, the primary surge prevention circuit 212 includes a bootstrap current based surge suppressor (e.g., integrated floating charge pump gate voltage generator with automatic restart from input voltage glitches). In other example embodiments, the primary surge prevention circuit 212 includes an integrated floating charge pump gate voltage generator without automatic restart, a separate floating gate voltage generator, an over-voltage comparator, a voltage regulation circuit, a depletion mode N or P-channel FET or PNP pass element with ground reference control circuit, a depletion mode FET pass element, or a mechanical relay.

The secondary surge prevention circuit 214 includes a clamp circuit that draws current large enough to trigger the fuse 208 if the primary surge prevention circuit 212 fails. In other example embodiments, the output of the secondary surge prevention circuit 214 is used to reset or disable the primary surge prevention circuit 212. The secondary surge prevention circuit 214 includes, for example, a TVS-based clamp with high current capability sufficient to trigger the fuse 208 with available fault current. In other example embodiments, the secondary surge prevention circuit 214 includes an over voltage crowbar protection circuit (SCR-based crowbar), a shunt voltage regulator, or a shunt transistor switch.

The inrush protection circuit 216 is connected to an output of the secondary surge prevention circuit 214 through a filter 222. The inrush protection circuit 216 limits current and turns off the current when the output voltage from the secondary surge prevention circuit 214 (e.g., clamp circuit)

is too high during a normal operating mode. The output of inrush protection circuit 216 provides low voltage power during the maintenance mode. In one example embodiment, the inrush protection circuit 216 includes circuit breaker function, over voltage lock-out, under voltage lock-out, and soft start features. In another example embodiment, the output of the secondary surge prevention circuit 214 is used to turn off the inrush protection circuit 216 via its over-voltage input or under-voltage input. In other example embodiments, no inrush protection circuit 216 is used and the second low voltage path 224 does not include the inrush protection circuit 216.

Figure 3:
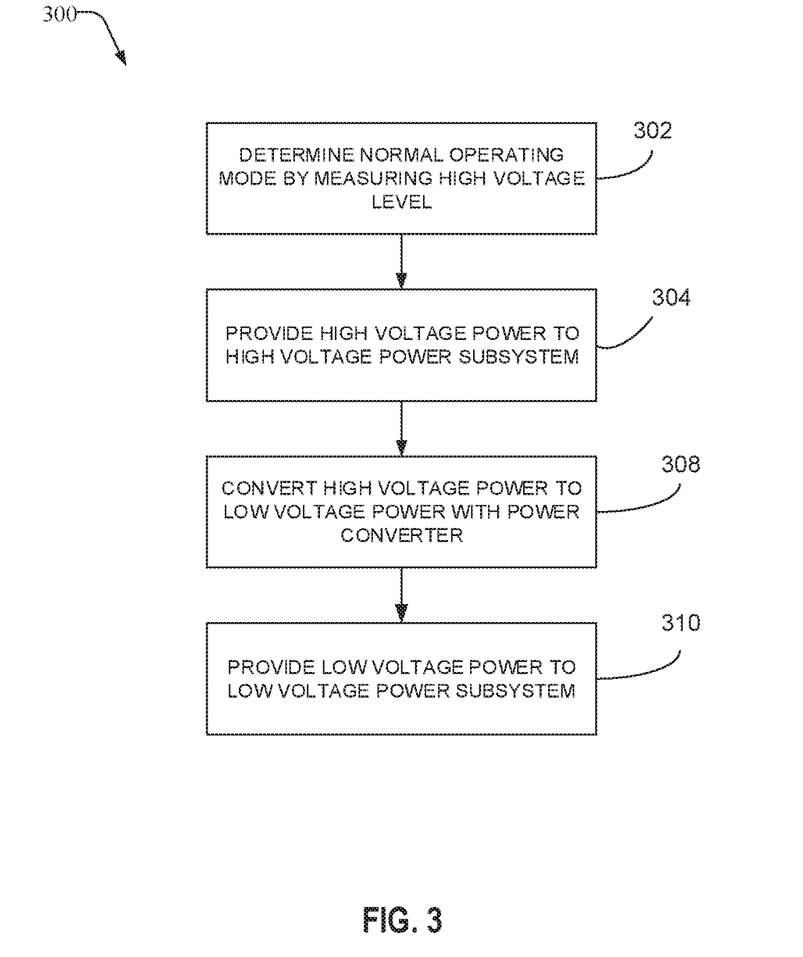
FIG. 3 is a flowchart illustrating an example embodiment of a method for operating a control circuit in an operating mode.

FIG. 3 is a flowchart illustrating an example embodiment of a method 300 for operating the dual mode control circuit 108. At operation 302, the dual mode control circuit 108 determines that the plasma chamber system 110 is operating in the normal operating mode (e.g., by measuring a high voltage level input to the dual mode control circuit 108). At operation 304, the dual mode control circuit 108 provides the high voltage power from the high voltage power supply 102 to the high voltage power subsystem 112. At operation 308, the dual mode control circuit 108 protects the low voltage power subsystem 114 by converting the high voltage power to the low voltage power with a power converter (e.g., DC to DC converter 210). At operation 310, the dual mode control circuit 108 provides the low voltage power to the low voltage power subsystem 114. In an alternative embodiment, the dual mode control circuit 108 protects the low voltage power subsystem 114 by preventing any power from reaching the low voltage power subsystem 114 by using the components of the low voltage circuit 206.

Figure 4:
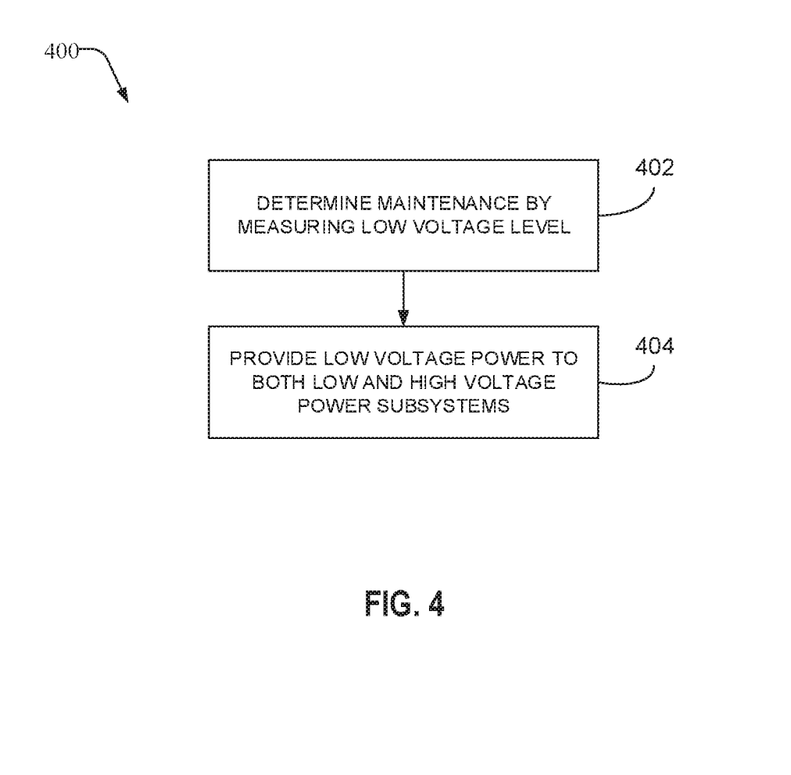
FIG. 4 is a flowchart illustrating an example embodiment of a method for operating a control circuit in a maintenance mode.

FIG. 4 is a flowchart illustrating another example embodiment of a method 400 for operating the dual mode control circuit 108. At operation 402, the dual mode control circuit 108 determines that the plasma chamber system 110 is operating in the maintenance mode (e.g., by measuring a low voltage input to the dual mode control circuit 108). At operation 404, the dual mode control circuit 108 provides the low voltage power from the low voltage power supply 104 to the low voltage power subsystem 114. In one example embodiment, the dual mode control circuit 108 does not provide any power to the high voltage power subsystem 112. In another example embodiment, the dual mode control circuit 108 provides the low voltage power to both the low voltage power subsystem 114 and the high voltage power subsystem 112. The low voltage power is not high enough to generate plasma inside the chamber. Thus, a maintenance worker would not be subjected to hazardous conditions because of the low voltage power.

The description above includes illustrative examples, devices, systems, and methods that embody the disclosed subject matter. In the description, for purposes of explanation, numerous specific details were set forth in order to provide an understanding of various embodiments of the disclosed subject matter. It will be evident, however, to those of ordinary skill in the art that various embodiments of the subject matter may be practiced without these specific details. Further, well-known structures, materials, and techniques have not been shown in detail, so as not to obscure the various illustrated embodiments.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the techniques and examples provided herein may all be applied in various combinations.

Although various embodiments are discussed separately, these separate embodiments are not intended to be considered as independent techniques or designs. As indicated above, each of the various portions may be interrelated and each may be used separately or in combination with other particulate matter sensor calibration system embodiments discussed herein.

Consequently, many modifications and variations can be made, as will be apparent to the person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A dual mode power device comprising:
a power supply connector configured to be coupled with one of a first voltage power supply or a second voltage power supply; and
a control circuit coupled between an output of the power supply connector and a first and second voltage subsystem of a plasma processing apparatus, the control circuit configured to:
provide a first voltage based on the first voltage power supply to the first voltage subsystem in a first mode of operation of the plasma processing apparatus in response to the power supply connector being connected to the first voltage supply, and
provide a second voltage based on the second voltage power supply to the second voltage subsystem in a second mode of operation of the plasma processing apparatus in response to the power supply connector being connected to the second voltage power supply.

2. The dual mode power device of claim 1, wherein the first mode of operation includes an operating mode of the plasma processing apparatus using the first voltage, wherein the second mode of operation includes a maintenance mode of the plasma processing apparatus using the second voltage.

3. The dual mode power device of claim 2, wherein the operating mode is configured for processing a water disposed in a chamber of the plasma processing apparatus, wherein the maintenance mode is configured for testing or calibrating components of the plasma processing apparatus.

4. The dual mode power device of claim 2, wherein the control 114 is configured to:
  detect the first voltage in response to the power supply connector being connected to the first voltage supply,
  provide the first voltage to the first voltage subsystem in the operating mode,
  convert the first voltage to the second voltage, and
  provide the second voltage to the second voltage subsystem in the maintenance mode.

5. The dual mode power device of claim 1, wherein the power supply connector includes a single input connector configured to receive one of the first voltage power supply or the second voltage power supply.

6. The dual mode power device of claim 2, wherein the control circuit further comprises:
  a first electrical circuit connected between the output of the power supply connector and an input of the first voltage subsystem; and
  a second electrical circuit connected between the output of the power supply connector and an input of the second voltage subsystem.

7. The dual mode power device of claim 6, wherein the second electrical circuit comprises:
  a fuse configured to break the second electrical circuit in response to detecting, on the second electrical circuit, the first voltage generated by the first voltage power supply;
  a primary surge prevention circuit coupled to the fuse, the primary surge prevention circuit configured to be disabled in the first mode of operation, and to be enabled in the second mode of operation;
  a secondary surge prevention circuit coupled to the primary surge prevention circuit;
  an inrush protection circuit coupled to the primary and secondary surge prevention circuits, the inrush protection circuit configured to limit a current from the primary and secondary surge prevention circuit;
  a Direct Current (DC) to DC converter coupled to the fuse, the DC to DC converter configured to convert the first voltage to the second voltage;
a first mode circuit coupled to the primary surge prevention circuit, the first mode circuit configured to disable the primary surge prevention circuit in response to detecting the first voltage generated by the first voltage power supply; and
  a diode-based switch circuit coupled to the inrush protection circuit and the DC to DC converter, the diode-based switch circuit configured to select between an output of the inrush protection circuit and an output of the DC to DC converter.

8. The dual mode power device of claim 7, wherein the fuse is configured to disable power to the second electrical circuit.

9. The dual mode power device of claim 7, wherein the DC to DC converter is powered by the first voltage power supply in the first mode of operation.

10. The dual mode power device of claim 7, wherein the primary surge prevention circuit includes at least one of a bootstrap current-based surge suppressor with automatic restart, a bootstrap current-based surge suppressor without automatic restart, a plurality of floating gates, a depletion mode pass element with ground reference control circuit, a depletion mode pass element, or a mechanical relay.

11. The dual mode power device of claim 7, wherein the secondary surge prevention circuit includes at least one of a clamp circuit, a shunt voltage regulator, or a shunt transistor switch.

12. The dual mode power device of claim 7, wherein an output of the DC to DC converter is used to disable the primary surge prevention circuit or the inrush protection circuit.

13. The dual mode power device of claim 7, wherein an output of the secondary surge prevention circuit is used to disable the primary surge prevention circuit or the inrush protection circuit.

14. The dual mode power device of claim 7, wherein an input voltage at the fuse is used to turn off the primary surge prevention circuit in response to the input voltage corresponding to the first voltage of the first voltage power supply.

15. The dual mode power device of claim 6, further comprising:
  a radio frequency (RF) filter disposed between the output of the power supply connector and the control circuit, the RF frequency filter configured to filter signals from the first voltage power supply; and
  a switch coupled to the first voltage power supply and the second voltage power supply, the switch being configured to connect the first voltage power supply to the control circuit in the first mode of operation, and the second voltage power supply to the control circuit in the second mode of operation.

16. The dual mode power device of claim 1, wherein the first voltage is more than 300 Volts, wherein the second voltage is less than 15 Volts.

17. A dual mode power source system comprising:
  a first voltage power supply for generating a first voltage for powering a first voltage subsystem of a plasma processing apparatus, the first voltage subsystem being configured to operate based on the first voltage in a first mode of operation of the plasma processing apparatus;
  a second voltage power supply for generating a second voltage for powering a second voltage subsystem of the plasma processing apparatus, the second voltage subsystem being configured to operate based on the second voltage in a second mode of operation of the plasma processing apparatus; and
  a control circuit having an input configured to receive signals from one of the first voltage power supply and the second voltage power supply, and an output of the control circuit coupled to the second voltage subsystem, the control circuit being configured to:
  protect the second voltage subsystem from the first voltage power supply during the first mode of operation in response to the input receiving signals from the first power voltage supply;
  prevent the first voltage power supply from powering the second voltage subsystem in the second mode of operation in response to the input receiving signals from the first power voltage supply; and
  allow the second voltage power supply to power both the first voltage subsystem and the second voltage subsystem.

18. The dual mode power device of claim 17, wherein the first mode of operation includes an operating mode of the plasma processing apparatus using the first voltage, wherein the second mode of operation includes a maintenance mode of the plasma processing apparatus using the second voltage.

19. The dual mode power device of claim 18, wherein the operating mode is configured to process a wafer disposed in a chamber of the plasma processing apparatus, wherein the maintenance mode is configured to test or calibrate components of the plasma processing apparatus.

20. The dual mode power device of claim 18, wherein the control circuit is configured to:
- detect the first voltage in response to the input receiving signals from the first power voltage supply,
- provide the first voltage to the first voltage subsystem in the operating mode,
- convert the first voltage to the second voltage, and
- provide the second voltage to the second voltage subsystem in the operating mode.

* * * * *